United States Patent [19]

Frank

[11] 3,898,532

[45] Aug. 5, 1975

[54] PROTECTION CIRCUIT FOR TRANSISTORIZED AUDIO POWER AMPLIFIER

[75] Inventor: Howard L. Frank, Skokie, Ill.

[73] Assignee: Sherwood Electronics Laboratories, Inc., Chicago, Ill.

[22] Filed: Jan. 28, 1974

[21] Appl. No.: 437,392

[52] U.S. Cl. .............. 317/31; 317/33 R; 330/207 P

[51] Int. Cl. .............................................. H02h 7/20

[58] Field of Search ......... 317/31, 33 R; 330/207 P; 179/1 A

[56] References Cited

UNITED STATES PATENTS

| | | | |
|---|---|---|---|
| 3,564,338 | 2/1971 | Teshihiko et al. | 317/31 |
| 3,579,042 | 5/1971 | Abend | 317/33 R |
| 3,731,153 | 5/1973 | Nishimoto | 317/33 R |
| 3,761,775 | 9/1973 | Ozawa et al. | 330/207 P |

*Primary Examiner*—James D. Trammell

*Attorney, Agent, or Firm*—Wallenstein, Spangenberg, Hattis & Strampel

[57] ABSTRACT

In a transistorized multi-channel audio system there is provided a protection circuit which protects the loudspeaker or other load device of each channel from damage where the load current carrying terminals of the power transistors are shorted, and protects the power amplifier transistors thereof from damage due to unduly low loudspeaker impedance conditions by adding to current and/or dissipation limiting circuits a protection circuit which disconnects the loudspeaker or other load device from the power amplifier under such conditions. The protection circuit includes preferably a bridge-type circuit in each channel whose output voltage is a function of both the current flow through the power amplifier transistors and the impedance value of the loudspeaker or the load device thereof. This is best achieved by varying the amplitude of the input voltage applied to the bridge circuit in accordance with the variation in power transistor load current, and placing the load device so the variation in its impedance varies the degree of unbalance of the bridge circuit. A control circuit responds to a given predetermined magnitude of the bridge output voltage preferably by disconnecting the loudspeakers or load devices of all channels. The control circuit is also similarly responsive to abnormal voltage conditions in the power amplifier circuit resulting from the power amplifier transistors.

14 Claims, 7 Drawing Figures

PROTECTION CIRCUIT FOR TRANSISTORIZED AUDIO POWER AMPLIFIER

BACKGROUND OF THE INVENTION

The present invention relates to the protection of transistors and load devices in transistorized power amplifiers which are to amplify AC signals with a varying amplitude and waveshape with minimum signal distortion, such as in the case of audio amplifiers used in high fidelity recording and sound reproducing equipment.

In high fidelity audio amplifiers and the like, the necessity for designing protective circuits which do not adversely interfere with the high fidelity amplification of a signal varying in amplitude and wave shape places severe restrictions on the nature of the protective circuits involved. For example, since transistorized power amplifiers are current rather than voltage amplifying devices, where extremely low value load resistors are present in the load current-carrying portions of the power amplifier circuit, the protective circuits for the transistors and the load devices should not incorporate in the main load current paths of the transistor any elements which absorb any significant amount of power or which introduce distortion components in the amplified signal. Moreover, the utilization of conventional fuses for preventing overload current conditions does not always satisfactorily protect the transistors and the load speakers or other load devices, because of the wide tolerances in the response times of typical overload current fuses and because the transistors can be damaged when they have developed thereacross relatively high voltages when operated at significant current levels well below the levels which would blow the fuses. Since the replacement of power transistors and loud speakers involve substantial costs to the user, it becomes of great importance to the successful marketing of a transistorized power amplifier to minimize the likelihood of transistor failure due to unusually low loudspeaker impedances and the destruction of the very expensive loudspeakers due to short circuiting of the power transistor load terminals.

High power output over a wide bandwidth is a great concern to the designer of high power transistor amplifiers which drive the loudspeakers. The wide bandwidth power capabilities of power amplifiers has been extended in recent years with the introduction of higher speed power transistors which have a correspondingly reduced ability to withstand fault conditions for even very short periods of time. Safe power transistor operation requires limitations on both the voltage and load current conditions of the power transistors, and while many protection circuits have been devised to prevent these conditions, none has been entirely satisfactory, particularly where emitter to collector voltages are in their upper ranges of values such as occurs when loudspeaker impedances drop below normal acceptable levels. It is a relatively simple matter to limit the collector current, but the high emitter to collector voltages occurring below the limited collector current levels has created problems which have not been entirely solved by dissipation limiting circuits which respond both to emitter to collector voltage and collector current conditions of the less rugged high speed power transistors.

It is thus a principal object of the present invention to provide a transistorized power amplifier of the type described which incorporates protection circuits which assure the user that his power transistors will not be damaged by unduly low load device impedances.

Another object of the invention is to provide a transistorized power amplifier of the type described which incorporates protection circuits which assure the user that his expensive loudspeakers or other load devices will not be damaged by short circuiting of the power transistors.

SUMMARY OF THE INVENTION

In accordance with one of the features of the invention, there is provided in a power amplifier of the kind described having a collector current limiting circuit, an additional transistor protection circuit responsive directly to the reduction of the load device impedance below given levels by disconnecting the load device from the power amplifier. In the most advantageous form of the invention, the load device impedance responsive circuit is one which responds to various combinations of progressively lower than normal load device impedances and progressively increasing amounts of drive current applied to the power amplifier transistors by stopping current flow in the power amplifier transistors when such combined conditions approach transistor damaging conditions of operation. In its most preferred form, the load device impedance responsive circuit includes bridge circuit-forming impedances which place practically no load upon the power amplifier circuit, the input voltage to the bridge circuit increasing with the magnitude of the load current flow through the power amplifier (which increases with drive current). The output of the bridge circuit varies with both load device impedance and the input voltage to the bridge circuit.

In most transistorized power amplifier circuits, a pair of power transistors are connected in series, with their adjacent load (i.e. emitter or collector) terminals interconnected through a pair of very low resistance (e.g. under 1 ohm) series connected resistors, and the remote load terminals thereof connected to the opposite polarity terminals of a source of direct current energizing voltage whose output terminals present voltages of opposite polarity relative to a reference point usually referred to as ground. The base terminals of the power transistors are connected to signal driving means so one of the transistors is conductive only for that portion of the AC input signal having one polarity and the other transistor is conductive only for that portion of the AC input signal having the opposite polarity, and to a degree proportional to the instantaneous magnitude of the AC input signal. The load device, which may be a loudspeaker, is connected between the juncture of the series connected resistors and ground. The impedance of the load device is much greater than that of the impedance of each series connected resistor, so a reduction in the speaker impedance will result in the reduction in the voltage drop across the loudspeaker impedance, and an increase in the load current flow through the alternately conducting transistors and also in the voltage appearing at the series resistor connected load terminals of the transistors relative to ground.

In accordance with a specific preferred aspect of the invention, one of the series connected resistors and the loudspeaker or other load device constitute two arms of a bridge type circuit, and two other relatively very large impedances, to avoid any appreciable current drain and constituting the aforesaid bridge circuit-forming impedances, are connected in series across these two arms of the bridge circuit so the output terminals of the bridge circuit are the ungrounded loudspeaker terminal or other load device terminal, on the one hand, and the juncture between the two additional load impedances, on the other hand. The relative values of the impedances are such that the ungrounded load device terminal for a normal desired load device has a higher voltage than the other bridge output terminal, so a progressive reduction in the load device resistance from a normal load will first cause the magnitude of the bridge output voltage (i.e. the difference between the voltages relative to ground at the bridge output terminals) to decrease to zero and then reverse in polarity.

When the transistors are driven by an AC input signal, the input to the bridge circuit receives an applied voltage which increases both with the drive of the transistors and with any reduction in load device impedance, so that the magnitude of the bridge circuit output is a function both of the degree to which the transistors are driven as well as the actual impedance value of the loudspeaker or other load device.

By properly selecting the relative values of the various impedances of the bridge circuit, the bridge circuit output voltage reaches a given control value of the reverse polarity for load impedance valves and transistor drive conditions which cause various combinations of transistor load current and load terminal voltage value which closely approach but do not reach these values which damage the transistors.

The output terminals of the bridge circuit are, most advantageously, connected to a very sensitive comparator circuit which effects a load device disconnection operation when the bridge output voltage reaches said control value.

This unique protection circuit protects the power transistors to a degree not heretofore accomplished in power amplifiers of the type being described, where it is important not to introduce significant power dissipation or frequency response deteriorating elements into the amplifier.

In accordance with another feature of the invention, loudspeaker load devices are protected against damage by the short circuiting of either of the aforesaid power amplifier transistors by circuits which effect a loudspeaker disconnect operation under the voltage conditions present when a short circuit develops across either of the power amplifier transistors. In the form of the invention where a protection circuit is provided which responds to the degree of drive of the power amplifier transistors and the value of the load device impedance, the voltage conditions created by a short circuit of either of the power amplifier transistors most advantageously results in the generation of a signal which is fed to a comparator circuit which senses the difference in the polarity and magnitude of the bridge output voltage, to produce the same result as a bridge output signal of the inverse polarity value which effects a load device disconnect operation.

DESCRIPTION OF PREFERRED EMBODIMENT OF THE INVENTION

Figure 1:
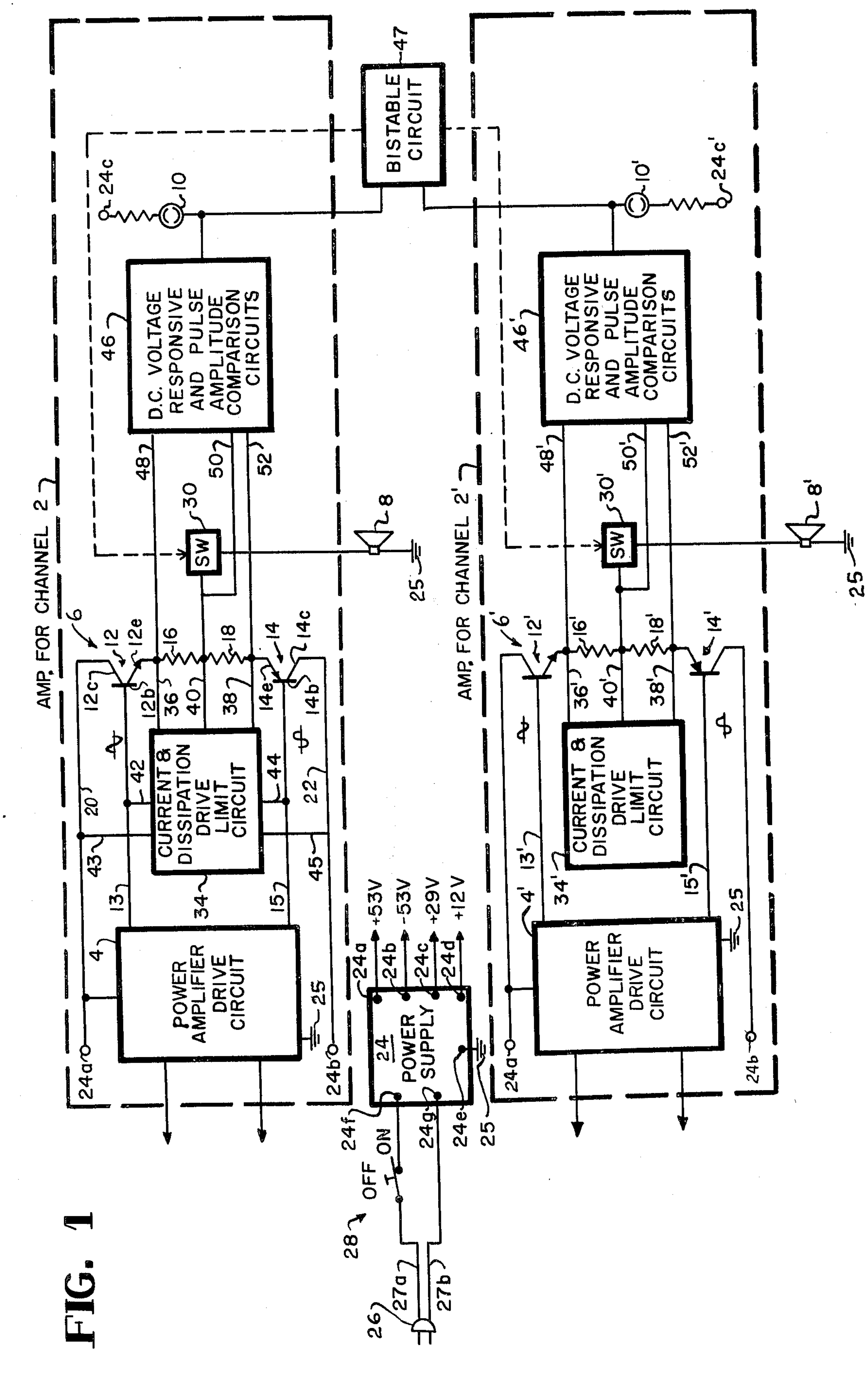
FIG. 1 is a partial block diagram of a two channel amplifier system for driving a pair of loudspeakers and including the basic components of exemplary protection circuits of the present invention shown in block form.

Referring now more particularly to FIG. 1, a stereo amplifier system is there shown comprising two amplifier channels 2 and 2′ including exemplary protection circuits of the invention to be described. The amplifier channels respectively include power amplifier drive circuits 4 and 4′ which respectively receive signals from the output of a stereo FM tuner, stereo pick-up cartridge, tape recorder or the like. The power amplifier drive circuits 4 and 4′ respectively drive transistor power amplifiers generally indicated by reference numerals 6 and 6′ which, in turn, drive loudspeakers 8 and 8′. As previously indicated, protection circuit of the invention protects the transistors of the power amplifiers 6 and 6′ from excessive voltage and current conditions caused primarily by undesirably low loudspeaker impedances resulting, for example, from the attachment of improperly matched loudspeakers or the excessive paralleling of loudspeakers which reduce the overall loudspeaker impedances to levels which cause voltage and current conditions which can damage the transistors of the power amplifier. Also, in the most preferred form of the invention, the loudspeakers 8 and 8′ are protected against damage due to short circuits of the transistors of the power amplifiers 6 and 6′. Additionally, a suitable annunciator device may be provided for each amplifier channel (or less desirable a common annunciator device shared by the amplifier channels), such as annunciator lights 10 and 10′, each of which, when energized, indicates that the associated amplifier channel 2 or 2′ has a fault condition due to an unduly low loudspeaker impedance condition or a power transistor short circuit condition. Should either of these fault conditions develop in only one of the amplifier channels, both loudspeakers 8 and 8′ are automatically disconnected from the power amplifier circuit 6 and 6′, so the resultant complete disappearance of sound will inform the user that a fault condition exists in the system. (If only one of the loudspeakers 8 were to be disconnected from its associated power amplifier circuit, a casual listener might not appreciate the disconnection of such loudspeaker if the other loudspeaker were also still in operation.)

The amplifier channels 2 and 2′ including the protection circuits of the present invention incorporated therein are substantially identical, and thus the details of only one of these channels will now be described, except where reference to the other channel is deemed helpful. In any event, corresponding elements of the two amplifier channels where numbered in the drawings have been given similar reference numbers, except that a prime (′) has been used for the numbered component parts of the amplifier channel 2′.

The power amplifier 6 includes a NPN transistor 12 and a PNP transistor 14. The emitters 12*e* and 14*e* of transistors 12 and 14 are connected together through a pair of preferably identical series connected resistors 16 and 18 of a resistance of only a fraction of an ohm, so that little power is dissipated therein. The collectors 12*c* and 14*c* of transistors 12 and 14 are respectively connected to power conductors 20 and 22 which are respectively connected to output terminals 24a and 24*b* of a DC power supply 24 which provides identical DC voltages at the terminals 24*a* and 24*b*, but of opposite polarity relative to a reference point or ground 25 to which power supply ground terminal 24*e* is connected.

A loudspeaker disconnect switch means 30 (which may be an electronic switch or relay contacts) is connected between the juncture of the emitter connected resistors 16 and 18 and the ungrounded terminal of the loudspeaker 8, whose opposite terminal is connected to ground 25. (A similar switch means 30′ interconnects the juncture of resistors 16′ and 18′ in power amplifier 6′ and loudspeaker 8′.) The continuity for emitter to collector current flow of the transistors 12 and 14 is through the switch means 30 and the loudspeaker 8 to ground. The switch means 30 is opened to protect the transistors 12 and 14 and loudspeaker 8 against damaging conditions to be described. The impedance of the loudspeaker 8 is at least about one order of magnitude greater and preferably somewhat greater than 10 times the magnitude of each of the resistors 16 and 18. It is assumed for normal power amplifier operation that the coil impedance of the loudspeaker 8 is not less than about two ohms, which encompasses practically all of the high quality loudspeakers on the market today. More typically, loudspeaker impedances are of the order of 4 ohms or greater, so that two loudspeakers could be paralleled without lowering the resultant loudspeaker impedance connected in series with the resistors 16 and 18 below 2 ohms for normal circuit operation.

The bases 12*b* and 14*b* of transistors 12 and 14 are connected by conductors 13 and 15 respectively to power amplifier drive circuit 4 which applies to these bases AC input signals of identical waveform but of exactly opposite phase. Since the NPN transistor 12 conducts when the base is positive with respect to its emitter and the PNP transistor 14 conducts when its base is negative with respect to its emitter, it is apparent that with AC input signals on bases 12*b* and 14*b* of opposite phase the transistors 12 and 14 conduct during alternate half cycles of the initial AC input signal fed to the amplifier drive circuit 4. When no AC input signal appears on the bases 12b and 14b of transistors 12 and 14, the transistors will be in a substantially nonconductive state. Transistors 12 and 14 act as current amplifiers which provide a collector current which is linearly proportional to the amplitude of the AC input signal fed to the bases thereof.

The power supply 24 may be a conventional power supply which provides a variety of voltage outputs for different parts of the amplifier and exemplary protection circuit to be described, and may be energized from an AC power source connected to the power supply by a conventional power plug 26 and associated power conductors 27*a*–27*b* coupled to power supply input terminals 24*f* and 24*g*. An on-off switch 28 interconnects one of the power conductors 27*a* with one of the input terminals 24*f* of the power supply 24 in the usual manner.

Figure 2:
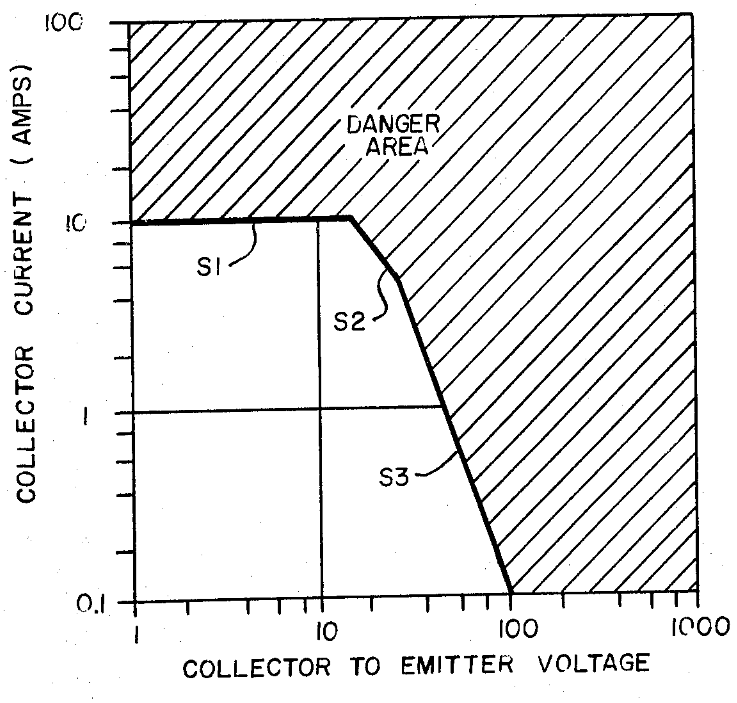
FIG. 2 illustrates a curve drawn on logarithmic scales illustrating the various collector to emitter voltages and collector current values which create transistor damaging conditions for an epi-base power transistor.
Figure 3:
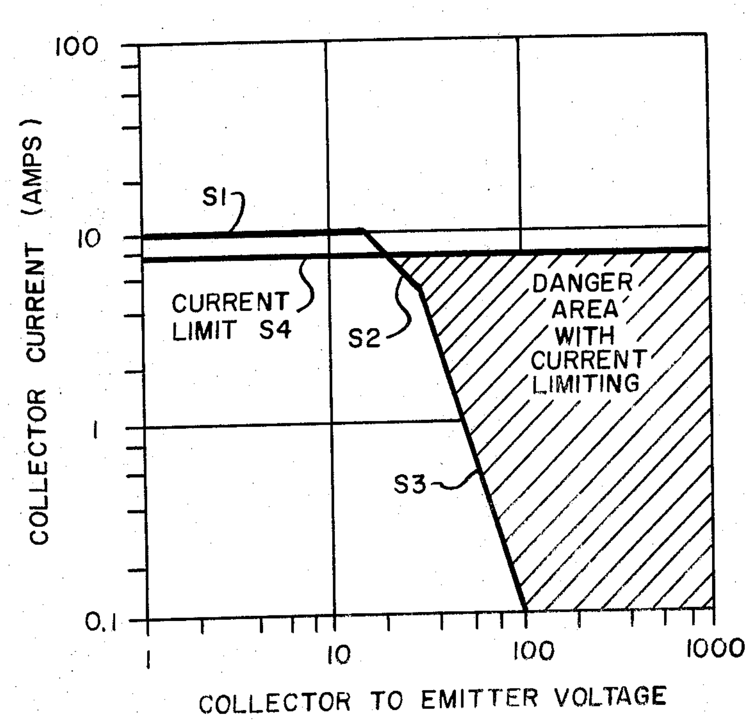
FIG. 3 is a curve indicating the various collector to emitter voltages and collector current values which can create transistor damaging conditions for the epi-base transistor referred to, when a conventional drive current limiting protection circuit is connected to the base of the power transistor to limit the collector current flowable in the transistor.

To understand the operating conditions which can damage the power transistors 12 and 14, as an example consider a power amplifier designed to deliver 100 watts into a 4 ohm loudspeaker load with wide bandwith power capabilities and with conventional current and dissipation limiting circuits to protect the same. To supply this power, the power transistors 12 and 14 may have to supply 7.5 amp peak collector current and accept a power supply voltage of 100 volts. If the power transistors 12 and 14 were 10 ampere, 100 volt epibase devices with a dissipation rating of 150 watts, the safe operating area curve therefor is that shown in FIG. 2, with the cross-hatched areas representing the unsafe areas of operation. To eliminate the possibility of the transistors entering the forbidden areas, the provision of current limiting circuits to prevent collector currents above the 10 ampere curve segment S1 as shown in FIG. 3 would be inadequate since a 7.5 amp peak collector current is unsafe with emitter to collector voltages in excess of 20 volts (where such voltages are low frequency or sustained voltages since the curves are applicable to such conditions). Such emitter to collector voltages occur, for example, when the loudspeaker impedance reaches an abnormally low value of a poorly made loudspeaker made to such loose tolerances that its impedance drops below 2 ohms when a speaker malfunctions, or when the user makes improper connections.

Figure 4:
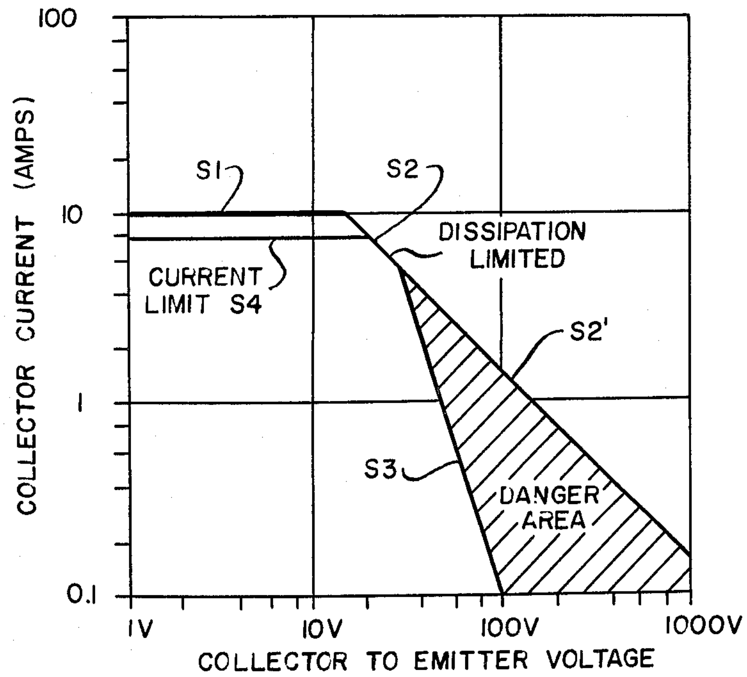
FIG. 4 is a curve indicating the various collector to emitter voltages and collector current values which can create transistor damaging conditions for the epi-base transistor referred to, when a conventional drive current and dissipation limiting circuit is connected to the base of the power transistor to limit or reduce the collector current flowable in the transistor.

While adding a dissipation limiting circuit can limit the voltage-current relationship to a safe value to the left of the curve segment S2, as shown in FIG. 4 this would give no protection where the loudspeaker impedance dropped to a value where the emitter to collector voltage exceeded the various current voltage conditions in the cross-hatched area between curve segments S2′ and S3 in FIG. 4.

Figure 5:
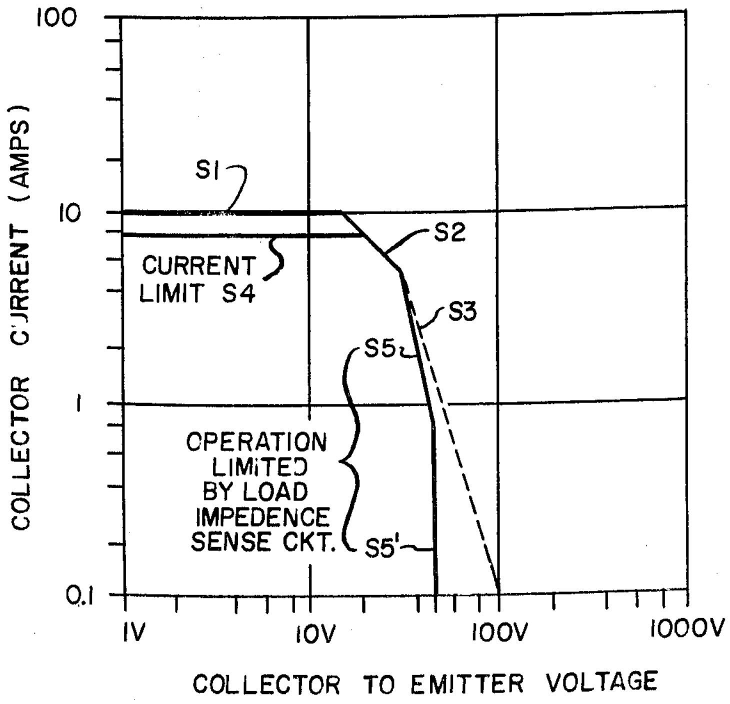
FIG. 5 illustrates the manner in which the present invention limits the collector to emitter voltage and collector current levels to a value which completely protects the transistor involved against transistor-damaging operating conditions.

As previously indicated, the protection circuit of the present invention protects the transistor against operation in this area by limiting transistor operation to the conditions, for example, exemplified by curve segments S5 and S5′ in FIG. 5, by disconnecting all loudspeakers (or other load devices) in the amplifying system when the impedance of the loudspeaker drops to a level where, under the signal driving conditions involved, the power transistors can be damaged, and by means which do not have any deleterious effect on the signal delivered to any acceptable load.

The circuits which effect the current and dissipation limiting action illustrated in FIGS. 2–5 are more or less conventional and are represented by boxes 34 and 34' in FIG. 1. In effect, the circuits 34 and 34' shunt drive current from the bases 12b and 14b of the transistors 12 and 14 in accordance with the limiting action indicated in FIGS. 3–5 by curve segments S1 and S2.

The protection circuit of the preferred form of the invention includes separate DC voltage responsive and pulse amplitude comparison circuits 46 and 46' in the amplifier channels 2 and 2', each of which generates a loudspeaker disconnect signal fed to a control circuit which effect preferably the disconnection of both loudspeakers 8 and 8' by the opening of the switch means 30 and 30' in series therewith. While separate control circuits could be associated with the DC voltage responsive and pulse amplitude comparison circuits 46 and 46', in the preferred exemplary form of the invention being described a common control circuit in the form of a bistable circuit 47 is provided which, when triggered from an initial to an opposite stable state, operates a relay or generates a voltage which effects the opening of the switch means 30 and 30' when the DC voltage responsive and pulse amplitude comparison circuits 46 or 46' senses voltage conditions which indicate that the loudspeaker impedance of the associated amplifier channel has reached what is an unsafe value. In the preferred form of the invention, whether or not the loudspeaker impedance is at an unsafe low value depends upon the drive conditions of the power transistors. Thus, if the loudspeaker 8 or 8' is completely short circuited, it does not take the presence of much collector current to effect a loudspeaker disconnect operation. On the other hand, if the loudspeaker impedance is only slightly below the limiting value of approximately 2 ohms in the exemplary embodiment of the invention being described, then a loudspeaker disconnect operation will not take place unless the power transistors are being driven substantially, so that loudspeakers are not needlessly disconnected except under drive conditions which would actually create unsafe conditions of operation for the power transistors. Consequently, what is or what is not an unsafe abnormally low loudspeaker impedance depends upon the drive conditions of the transistor in the most preferred form of the invention. When such a condition exists in either of the amplifier channels, or when the emitter and collector terminals of the power transistors of the power amplifier 6 or 6' are short circuited, the associated DC voltage responsive and pulse amplitude comparison circuits 46 or 46' of the amplifier channel involved will drive the bistable circuit 47 from its initial to its opposite state to effect a loudspeaker disconnect operation affecting both loudspeakers 8 and 8'. Also, in the preferred form of the invention, the light emitting diode 10 or 10' associated with the channel in which the fault occurs will be energized, informing the user which of the amplifier channels has the unduly low loudspeaker impedance or transistor short circuiting conditions which effected the loudspeaker disconnect operation.

The manner in which the variation in loudspeaker impedance and the degree of drive applied to the transistors affect the voltage conditions of the circuit shown in FIG. 1 can be seen from the following analysis of the operation of power amplifier circuit 6. Thus, it will recalled, that in the exemplary form of the invention being described, when there is no drive current applied to the bases of the transistors 12 and 14 the transistors 12 and 14 are substantially non-conductive and the voltage at the emitters **12*e* and 14*e* of the transistors 12 and 14 and the voltage at the ungrounded terminal of the loudspeaker 8 will be zero or ground potential. As the drive current applied to the bases 12*b* and 14*b* progressively increases from zero, collector current will proportionately increase and the voltage with respect to ground at both the emitters 12*e* and 14*e* and the ungrounded terminal of the loudspeaker 8 will increase. However, the voltage at the emitters 12*e* and 14*e* will be greater than the voltage (i.e. the DC or AC voltage) at the ungrounded terminal of the loudspeaker 8. For a given drive current, if the loudspeaker impedance is progressively decreased, because the loudspeaker impedance is substantially greater than the impedance of either resistor 16 or 18, while the collector current will increase as expected, the voltage at the emitters 12e and 14e with respect to ground will also increase, despite the overall decrease of the resultant impedance of the circuit between the emitters 12*e* and 14*e* and ground. The voltage at the ungrounded terminal of the loudspeaker 8, however, will decrease. By sensing the relative value or difference between voltages derived from the voltages at the emitters 12*e* and/or 14*e* and the ungrounded terminal of the loudspeaker 8, a means for controlling the disconnection of the loudspeaker 8 is achieved by circuits like the DC voltages responsive and pulse amplitude comparison circuits 46 which responds when this voltage difference reaches a value and polarity which indicates that a loudspeaker disconnect operation should take place, by operating the bistable circuit 47 to cause disconnection of both loudspeakers 8 and 8'**.

Under normal circuit oprating conditions, the voltage appearing at the emitter 12e of transistor 12 with respect to ground alternates between some positive value and some negative value whereas the voltage at the emitter 14e of transistor 14 with respect to ground will alternate between some negative value and some positive value. If transistor 12 is short circuited, the continuous positive voltage os power conductor 20 appears at the emitter 12e, and when the transistor 14 is short circuited, the continuous negative voltage of the power conductor 22 will appear at the emitter **14*e*. Lines 48, 50 and 52 respectively extend from the emitter 12*e*, the side of the switch means 30 remote from the loudspeaker 8 and the emitter 14e to the DC voltage responsive and pulse amplitude comparison circuits 46. When the DC or pulsating voltages on these lines, 48, 50 and 52 are such as to indicate an unduly low loudspeaker impedance for the given drive conditions involved, or a short circuiting of the emitter and collector terminals of the transistors 12 and 14, bistable circuit 47** is operated to effect a loudspeaker disconnect operation.

Figure 6:
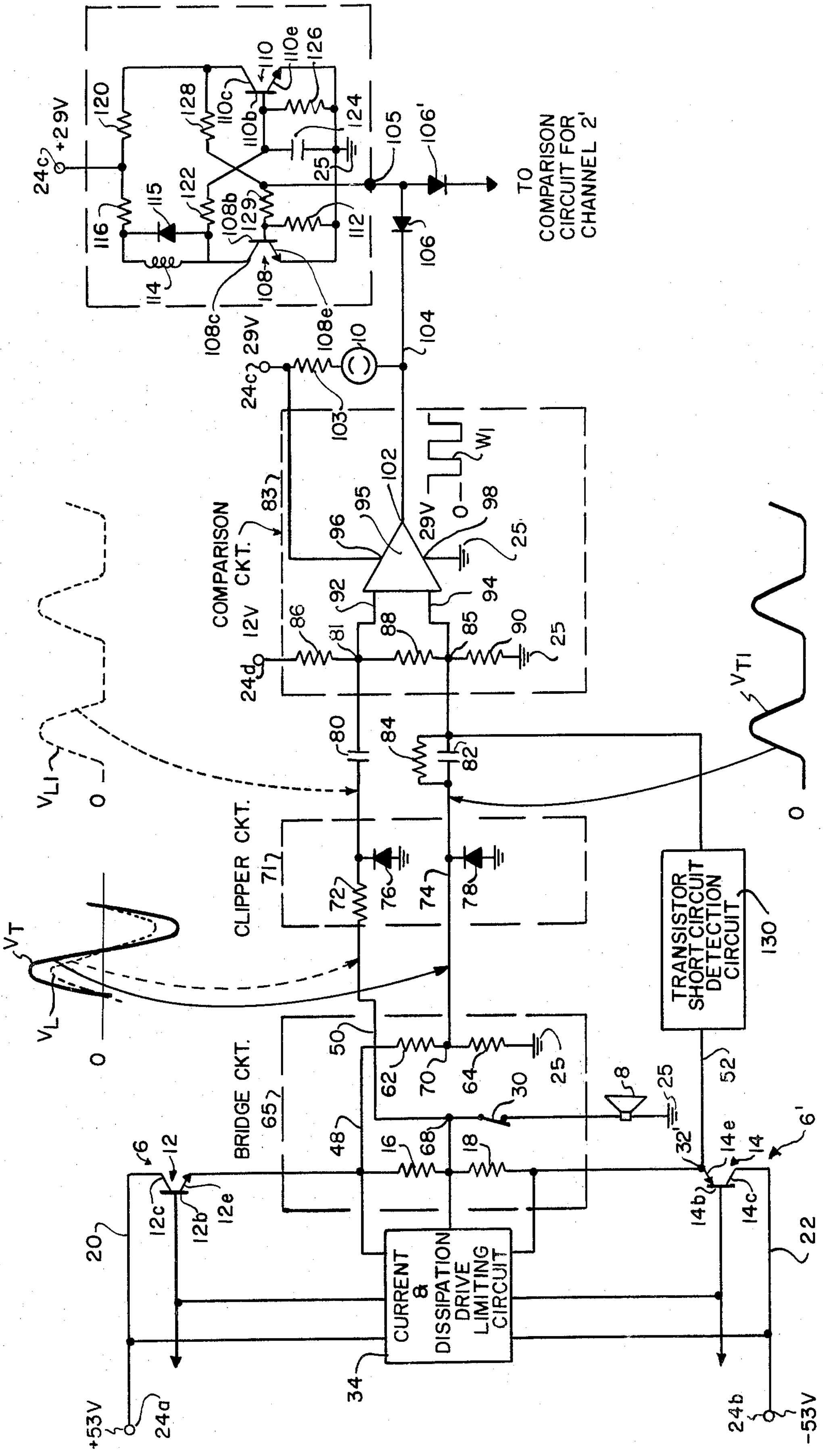
FIG. 6 shows in partial circuit diagram form the circuitry for that part of the protection circuit of the invention which responds to both the loudspeaker impedance and drive conditions of the power amplifier of one of the amplifier channels of FIG. 1.

Reference should now be made to FIG. 6, which illustrates the preferred circuitry for the DC voltage responsive and pulse amplitude comparison circuits 46 associated with the amplifier channel 2. The aforesaid line 48 extending from the emitter **12*e* of the transistor 12 is connected to ground 25 through series-connected bridge-forming resistors 62 and 64. Resistors 62 and 64** are of such large magnitude that they draw practically no current, and are of a value in the exemplary form of the invention being described such that the ratio of resistor 64 to 62 is less than the ratio of a normal loudspeaker impedance to the resistance of resistor 16 or 18, so the magnitude of the voltage at the juncture between resistors 62 and 64 is smaller with respect to ground than is the voltage at the ungrounded terminal of the loudspeaker 8. Resistors 62 and 64 form two arms of a bridge circit 65, the other two arms of which are constituted by the resistor 16 and the loudspeaker 8. The input terminals of the bridge circuit are the emitter 12*e* of the transistor 12 and ground, and the output terminals thereof are terminals 68 and 70 respectively located at the juncture between resistor 16 and the loudspeaker 8, on the one hand, and the juncture between resistors 62 and 64, on the other hand. Accordingly, when the loudspeaker impedance has a minimum limiting normal value, for example, the 2 ohms exemplary value referred to, during that portion of the AC input signal where the transistor 12 is conducting (and the transistor 14 is non-conducting) the voltage at the terminal 68 representing the voltage at the bridge output terminal connected to the loudspeaker 8 will be more positive with respect to ground than is the voltage at the bridge output terminal 70 at the juncture between resistors 62 and 64.

A clipper circuit 71 is provided to eliminate from the protection circuit any negative bridge output voltages present during the conduction of the transistor 14. Accordingly, there is connected between bridge output terminals 68 and ground a current-limiting resistor 72 and a negative going voltage clipping rectifier 76 which conducts under the presence of negative voltages to short circuit any such voltages from any circuits connected thereto. A negative going voltage clipping rectifier 78 is connected between a conductor 74 extending from the juncture of resistors 62 and 64 and ground, to bypass any negative going voltages from the circuits connected thereto. A coupling capacitor 80 is connected between the cathode of the clipping rectifier 76 and input terminal 81 of a comparison circuit 83, and a coupling capacitor 82 shunted by a relatively large resistor 84 interconnects the cathode of clipping rectifier 78 and an input terminal 85 of the comparison circuit 83. The comparison circuit 83, among other things, compares the relative magnitudes of the pulsating voltages coupled by the capacitors 80 and 82, and when the differences between these two voltages reaches a given magnitude and polarity (which preferably involves the inversion of the original polarity appearing at the bridge output terminals 68–70 under normal circuit conditions), a loudspeaker disconnect operation will take place in a manner to be described. The comparison circuit should not effect an alarm operation where the bridge circuit output is substantially zero, since it is zero both under conditions where the transistors 12 and 14 are undriven or under conditions where the loudspeaker impedance has dropped to a given value from a value like 4–8 ohms. When the loudspeaker impedance decreases from exemplary value like 4 ohms, the degree to which the voltage at bridge output terminal 68 is positive with respect to the bridge output terminal 70 will progressively decrease to a point where it first passes through zero and then becomes negative, reaching a given negative control value to which comparison circuit 83 responds under circumstances where a loudspeaker disconnect operation should occur to protect transistors 12 and 14. (Note that this polarity inversion necessary to operate the comparision circuit 83 is made possible by the fact that the ratio of the value of the resistance of resistors 64 and 62 is less than the ratio of the value of the loudspeaker impedance and the resistor 16.) As previously indicated, since the bridge input circuit voltage appearing at the emitter 12*e* with respect to ground will vary with the degree of drive applied to the transistor 12, a given degree of bridge circuit unbalance will produce different bridge circuit output voltages of a given polarity, and so the aforesaid negative control value will be reached for different combinations of transistor drive and loudspeaker impedance conditions which produce the different combinations of collector currents and emitter to collector voltages of the transistor 12 to satisfy the limiting conditions of FIG. 5.

A well-known comparison circuit 83 is illustrated in FIG. 6 which comprises an input voltage divider network made up of resistors 86 connected between a plus 12 volt power supply output terminal 24d and the comparison circuit input terminal 81, a resistor 88 connected between comparison circuit input terminals 81 and 85, and a resistor 90 connected between comparison circuit input terminal 85 and ground 25. The relative values of resistors 86 and 88 and 90 are such that, in the absence of any bridge output voltage, a biasing voltage appears across the resistor 88 which makes the terminal 81 positive with respect to comparison circuit input terminal 85 by an amount referred to as the control value, which effects a loudspeaker disconnect operation. The particular comparison circuit to be described is such that when the voltage with respect to ground coupled by capacitor 80 derived from bridge output terminals 68 is negative with respect to the voltage coupled by capacitor 82 derived from the bridge output terminal 70 by an amount equal to the biasing or control voltage originally developed across the resistor 88, the comparison circuit effects the loudspeaker disconnect operation.

Conductors 92 and 94 are connected between the comparison circuit input terminals 81 and 85 and a linear operational amplifier 95 connected as shown. The operational amplifier 95 has terminals 96 and 98 respectively connected to the plus 29 volt power supply terminal 24*c*and ground 25. The output terminal 102 of the operational amplifier 95 will, under the circuit conditions illustrated, be at plus 29 volts until the voltage fed to the comparison circuit input terminals 81 and 85 reach the aformentioned inverse polarity control value, whereupon the output voltage at output terminal 102 will drop to ground potential. Accordingly, the output of the operational amplifier 95 under conditions where a loudspeaker disconnect operation is to take place will comprise a series of narrow negative-going pulses as illustrated by waveform W1. FIG. 6 shows waveforms VL and VT respectively appearing at bridge output terminals 68 and 70 which, after being applied to the clipper circuit 71, results in pulsating waveforms VL1 and VT1 respectively appearing on the input sides of the capacitors 80 and 82. When the difference between instantaneous values of the pulsating voltages represented by the waveforms VL1 and VT1 coupled through capacitors 80 and 82 reaches or exceeds the inverse polarity control value referred to, the operational amplifier will provide an output at zero potential only as long as this condition persists.

The light emitting diode 10 is connected between the output terminal 102 of the operational amplifier 95 and one of the terminals of a current-limiting resistor 103 whose opposite terminal may be connected to the plus 29 volt power supply terminal 24c. Accordingly, the light emitting diode 10 will receive energizing current pulses only when the comparison circuit 83 detects a condition calling for a loudspeaker disconnect operation.

An isolating rectifier 106 is connected between the output terminal 102 of the operational amplifier 95 and an input terminal 105 of the bistable circuit 47. The bistable circuit 47 is preferably designed so it responds only to a succession of pulses fed from the output terminal 102 of the operational amplifier 95, to avoid a disconnect operation under a momentary transient condition where one or only a few pulses which could possibly trigger the bistable circuit are picked up at the input of the bistable circuit. The bistable circuit 47 can take a variety of forms but, as illustrated, it comprises a pair of NPN transistors 108 and 110. A resistor 112 is connected between the base 108b of transistor 108 and ground 25. A relay coil 114, having contacts which are the aforesaid loudspeaker disconnect switch means 30 and 30', is connected between the collector 108c of the transistor 108 and one terminal of a resistor 116 whose other terminal is connected to the plus 29 volt power supply terminal 24*c*. A resistor 120 is connected between the collector 110*c* of transistor 110 and the plus 29 volt power supply terminal 12c, and the emitter terminals 108*e* and 110*e* of the transistors 108 and 110 are connected to ground 25. A coupling resistor 122 is interconnected between the collector 108c of the transistor 108 and the base 110*b* of transistor 110. A capacitor 124 connected in parallel with a resistor 126 is connected between the base 110*b* of transistor 110 and ground 25. The capacitor 124 creates the aforementioned time delay of the bistable circuit operation.

The relative values of the various impedances making up the bistable circuit 47 are such that when DC power is first applied to the bistable circuit, the transistor 108 will always initially be conducting which creates voltage conditions which cause the other transistor 110 to be non-conductive in a conventional way. When a negative going output pulse is developed at the output of the operational amplifier 95, this negative going pulse causes the voltage of collector 108c of transistor 108 to increase momentarily, charging up the capacitor 124. When a series of such negative going pulses have occurred, the voltage on capacitor 124 is sufficient to initiate conduction of initially non-conducting transistor 110. This, in turn, causes voltage conditions which cause transistor 108 to become non-conductive which remains so until the bistable circuit is reset. When current flow ceases in the collector circuit of the transistor 108, the relay coil 114 becomes de-energized to cause opening of the contacts 30 and 30' connected to the loudspeaker 8 and 8', thereby disconnecting the same.

The input terminal 105 of the bistable circuit 47 is connected to the output of a similar operational amplifier associated with the amplifier channel 2' through an isolating rectifier 106' so that the bistable circuit 47 can be triggered into its loudspeaker disconnect state by a fault operation of the amplifier 2' in the manner just described for amplifier channel 2.

The bistable circuit 47 illustrated in the drawing is reset to its initial state where the transistor 108 is conductive and transistor 110 is non-conductive by momentary disconnection of the source of DC voltage thereto. This is effected by momentarily operating the on-off switch 28 shown in FIG. 1 to its "off" position. Of course, if the condition is corrected which initially triggered the bistable circuit 47 by the time the switch is reoperated to its "on" position, the bistable circuit 47 will remain in the normal condition where the transistors 108 and 110 are respectively conductive and non-conductive. Otherwise, it will immediately switch to a state where the transistors 108 and 110 are respectively non-conductive and conductive after a number of negative going pulses have been generated by one of the operational amplifiers associated with the amplifier circuits 2 or 2'. If automatic reset is desired, the bistable circuit 47 can be modified to function as a monostable multivibrator whose quasi-stable slate disconnects the loudspeaker terminals for a predetermined time period and then reverts to its stable state until it is triggered again.

Thus far, an explanation has been given as to how a loudspeaker disconnect operation occurs in response to an abnormal low loudspeaker impedance. Now, the manner in which a loudspeaker disconnect operation occurs due to a short circuited emitter and collector of the transistors 12 or 14 will be described. When the emitter and collector of transistor 12 is short circuited, the continuous positive DC voltage appearing on the power conductor 20 will appear at the emitter 12*e*, which will cause a continuous DC voltage to appear at the bridge output terminal 70 which is coupled through the resistor 84 to the comparison circuit input terminal 85. This will immediately cause the input voltage conditions of the operational amplifier 95 to be such as to cause its output to suddenly drop to ground potential and remain at that potential, thereby to switch the conductive states of the transistors 108 and 110 of the bistable circuit 47, initiating a loudspeaker disconnect operation.

Figure 7:
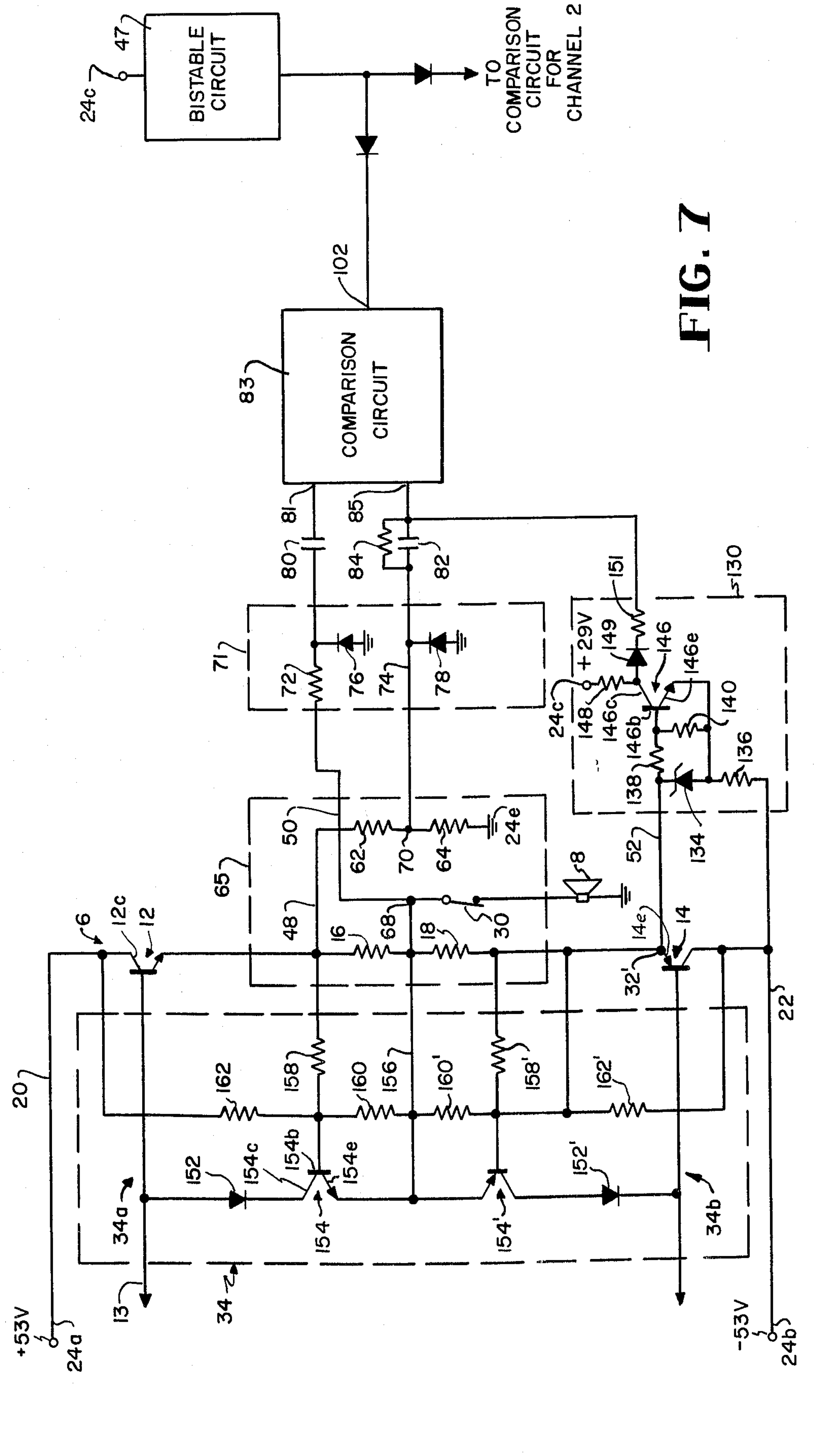
FIG. 7 shows in connection with the circuit of FIG. 6 exemplary circuitry for conventional drive current and dissipation limiting circuits and that part of the protection circuitry of the invention shown only in block diagram form in FIG. 6 which responds to the shorting of the load terminals of the bottommost power transistor.

When the emitter and collector of transistor 14 is short circuited, the continuous negative voltage on the negative DC power conductor 22 appears at the emitter 14*e* of the transistor 14 which is coupled by the line 52 to a resistor short circuit detecting circuit 130 shown in FIGS. 7. Although this circuit 130 may take a variety of forms, as illustrated, it includes a Zener diode 134 whose cathode is connected to the emitter 14*e* of the transistor 14 and whose anode is connected to one of the terminals of a resistor 136 whose opposite terminal is connected to the negative power conductor 22. Resistors 138 and 140 are connected in series across the terminals of the Zener diode 134, and the base 146*b* of a NPN transistor 146 is connected to the juncture of resistors 138 and 140. The emitter 146e of transistor 146 is connected to the juncture between the Zener diode 134 and the resistor 136, and the collector 146*c* of the transistor 146 is connected through a resistor 148 to the plus 29 volt terminal 24*c* of the power supply 24. A rectifier 149 and a resistor 151 are connected in series between the collector 146c of the transistor 146 and the comparison circuit side of the capacitor 82.

Under normal operation of the power amplifier transistor 14, the voltage conditions between the emitter and collector thereof are such that the Zener diode 134 will be conducting thereby, applying a positive voltage to the base 146*b* of the transistor 146, to render the transistor 146 conductive. This causes the voltage of the collector of transistor 146 to be a relatively negative potential which is isolated by the rectifier 149 from the input circuit of the comparison circuit 83. However, when the emitter to collector terminals of the transistor 14 are short circuited, the Zener diode 134 becomes non-conductive and the negative potential of the power conductor 22 is connected to the base 146*b* of transistor 146, rendering the same non-conductive, where the plus 29 volts of power supply terminal 24*c* is coupled through the rectifier 149 to the input terminal 85 of the comparison circuit 83, to drive the same into its loudspeaker disconnect state of operation where the output of the operational amplifier 95 is at ground potential.

FIG. 7 also illustrates exemplary circuitry for the current and dissipation limiting drive circuits 34 which comprise two similar circuits 34*a* and 34*b* respectively associated with the power transistors 12 and 14 and which operate NPN and PNP transistors 154 and 154′ respectively. Only the circuit 34*a* associated with the transistor 12 will now be described, it being understood that the other circuit 34b operates in a similar way to the circuit 34*a*.

The circuit 34a includes a rectifier 152 extending between the drive line 13 connected to the base of the power transistor 12 and the collector 154*c* of the NPN transistor 154 whose emitter 154*e* is connected by a conductor 156 to the juncture between the series connected resistors 16 and 18 associated with the emitters of the power transistors 12 and 14. The base 154*b* of the transistor 154 is connected by a resistor 158 to the emitter 12*e* of the power transistor 12. A resistor 160 is connected between the base 154*b* of transistor 154 and conductor 156. The transistor 154 is non-conductive until the collector current flow through the collector resistor 16 reaches a level which causes the voltage between the base and emitter of transistor 154 to reach a conducting level (which may be 0.65 volts). When the transistor 154 becomes conductive, a shunt path for the flow of drive current for the transistor 12 is developed through the emitter to collector circuit of the transistor 154, including the rectifier 152 oriented to permit such current flow. A dissipation limiting factor is added to the ci-cuit 34*a* by the connection of a resistor 162 between the base 154*b* of transistor 154 and the collector 12*c* of the power transistor 12.

While the present invention has nothing to do with specific values of the various circuit parameters which can vary widely, to permit an operating circuit to be made readily, the following circuit parameters are given by way of example only for the various circuit elements shown in FIG. 7:

Power transistor 12 — Motorola MJ3001 or the like
Power transistor 14 — Motorola MJ2501 or the like
Operational Amplifier 96 — Raytheon RC 4558 DN
Transistor 108 — Siemens BC169 or the like
Transistor 110 — Siemens BC169 or the like
Zener diode 134 — Motorola MZ294-2,4B or the like
Transistor 146 — Motorola MP5A06 or the like
R16 — 0.3 ohms
R18 — 0.3 ohms
R62 — 430 ohms -Continued R64 — 3000 ohms
R72 — 10,000 ohms
C80 — .22 microfarads
C82 — .22 microfarads
R84 — 680,000 ohms
R86 — 1.5 megohms
R88 — 56,000 ohms
R90 — 470,000 ohms
R103 — 1000 ohms
R120 — 2200 ohms
R122 — 82,000 ohms
R126 — 10,000 ohms
C127 — 10 microfarads
R112 — 4700 ohms
R128 — 15,000 ohms
R129 — 33,000 ohms
R136 — 5600 ohms
R138 — 1000 ohms
R140 — 1000 ohms
R148 — 12,000 ohms
R158 — 1000 ohms
R160 — 270 ohms
R162 — 56,000 ohms
R158′ — 1200 ohms
R160′— 270 ohms
R162′— 56,000 ohms The present invention has thus provided an exceedingly effective means for protecting both the power transistors and loudspeakers from damage without reducing to any significant degree the power output or high fidelity response of the amplifier equipment.

It should be understood that numerous modifications may be made in the most preferred forms of the invention without deviating from the broader aspects thereof.

I claim:

1. A power amplifier which is to amplify an input AC signal with a varying amplitude and waveshape with minimum signal distortion, said power amplifier comprising: transistor or transistor-like current amplifying means with load terminal means connected through load circuit means to the terminals of a source of direct current voltage and control terminal means connected to signal drive means which varies the magnitude of drive current fed through the load terminal means, and a protection circuit including means responsive both to various combinations of progressively lower than normal impedances in the load circuit means and progressively increasing degrees of control drive current applied to said transistor or transistor-like current amplifying means for producing a given control signal when such combined conditions approach transistor damaging conditions of operation, and load current termination means responsive to said given control signal by resettably terminating current flow in said transistor or transistor-like current amplifying means for at least a considerable period following the disappearance of said control signal.

2. The power amplifier of claim 1 wherein said transistor or transistor-like current amplifying means comprise a pair of series connected transistor or transistor-like current amplifying devices having their adjacent load terminals interconnected through a pair of series connected impedance means, their remote load terminals connected to the opposite polarity terminals of a source of direct current energizing voltage whose output terminals present voltages of an opposite polarity relative to a given reference point and their control terminals connected to signal driving means so one of the current amplifying devices is conductive only for that portion of an input AC signal having one polarity and the other current amplifying device is conductive only for that portion of the input AC signal having the opposite polarity and to a degree proportional to the instantaneous magnitude of the input AC signal, and a load device normally of much greater impedance than either of said pair of series connected impedance means and coupled between the juncture of said pair of impedance means and said reference point so the voltage between the adjacent load terminals and said reference point increases, and the voltage drop across the load device decreases with the decrease in impedance value of the load device, and said load current termination means includes means for terminating the load current of the power amplifier when the difference between the voltages derived from the end of one of said impedance means remote from said load device and said reference point, on the one hand, and the voltage drop across said load device, on the other hand, reaches a predetermined value.

3. The power amplifier of claim 2 wherein said load current terminating means includes a bridge circuit whose voltage output is a direct function of both the current flow through at least one of said transistor or transistor-like current amplifying devices and the impedance of the load device, and control means responsive to a given magnitude of the voltage output of the bridge circuit.

4. The power amplifier of claim 3 wherein there is formed with one of said series connected impedance means a bridge-type circuit where first and second arms of the bridge circuit are constituted by the latter impedance means and said load device and third and fourth arms of the bridge circuit are constituted by a pair of series connected impedance elements connected across said first and second bridge arms, said pair of impedance elements constituting the third and fourth arms of the bridge circuit having an impedance value so much greater than that of said impedance means and load device as not to constitute any significant current drain on the power amplifier, and said control means includes means responsive to the difference between the magnitudes of the voltages at the juncture between said first and second bridge arms, on the one hand, and said third and fourth bridge arms on the other hand.

5. The power amplifier of claim 4 wherein said control means responds to said given magnitude when it is of a reversed polarity from the bridge output at normal load circuit impedance levels.

6. The power amplifier of claim 5 wherein the value of the bridge-forming impedance element nearest said reference point is greater than that of the impedance element most remote therefrom but the ratio thereof is less than the ratio of the normal impedance value of said load device and said one impedance means so the voltage at the juncture of said bridge-forming impedance elements constituting one of the bridge output terminals is less than the voltage at the juncture of said emitter connected impedance means constituting the other bridge output terminal.

7. The power amplifier of claim 3 wherein the bridge circuit is formed by a pair of bridge-forming impedance elements coupled across a point of at least one of said pair of impedance means remote from said load device and said reference point, which bridge-forming impedance elements are of such a large value as not to place any significant drain on the current flowing through said pair of impedance means and load device.

8. The power amplifier of claim 1 wherein there is provided means responsive to the short circuiting of the load terminals of said current amplifying means for operating said load current terminating means.

9. In a power amplifier which is to amplify an input AC signal with a varying amplitude and waveshape with minimum signal distortion, said power amplifier including a pair of series connected transistor or transistorlike current amplifying devices with the adjacent load terminals thereof interconnected through a pair of series connected impedance means and with their remote load terminals connected to the opposite polarity terminals of a source of direct current energizing voltage whose output terminals present voltages of opposite polarity relative to a given reference point, said transistor or transistor-like current amplifying devices having control terminals connected to a source of AC signals to be amplified where one of the current amplifying devices is conductive only for the portion of the input AC signal having one polarity and the other current amplifying device is conductive only for that portion of the input AC signal having the opposite polarity and to a degree proportional to the instantaneous magnitude of the input AC signal, and a load device of much greater impedance than either of said impedance elements coupled between the juncture of said impedance elements and said reference point so the DC load and AC signal current components flow therethrough and so the voltage between the adjacent load terminals and said reference point increases and the voltage drop across the load device decreases with the decreasing impedance value of said load device, the improvement in a portection circuit for the current amplifying devices comprising control means responsive to voltages derived from the voltage adjacent the end of at least one of said impedance means remote from said load device and the voltage drop across the load device by resettably disconnecting said load device from the power amplifier circuit for at least a considerable period following such disconnection when the difference between said derived voltages reaches a predetermined value.

10. The power amplifier of claim 9 wherein there is formed with one of said series connected impedance means and load device a bridge type circuit where first and second arms of the bridge circuit are constituted by at least one of said pair of impedance means elements and said load device and third and fourth arms of the bridge circuit are constituted by a pair of series connected impedance elements connected across said first and second bridge arms, said pair of impedance elements constituting the third and fourth arms of the bridge circuit being of an impedance value so much greater than that of said impedance means and load device as not to constitute any significant drain from the load circuit, and said control means comprises means responsive to the difference between magnitudes of the voltages at the juncture between said first and second bridge arms, on the one hand, and said third and fourth bridge arms, on the other hand.

11. The power amplifier of claim 10 wherein the value of the bridge-forming impedance element nearest said reference point is greater than that of the impedance element most remote therefrom and the ratio thereof is less than the ratio of the normal impedance value of said load device and said one impedance means so the voltage at the juncture of said bridge-forming impedance elements is less than the voltage at the juncture of said emitter connected impedance means.

12. The power amplifier of claim 10 wherein said control means includes a comparison circuit having a pair of input terminals, means for coupling the juncture between said first and second bridge circuit arms and said third and fourth bridge circuit arms respectively to the two input terminals of said comparison circuit, and clipping circuit means for coupling voltages of only one polarity between said juncture points and said input terminals of said comparison circuit, said comparison circuit comparing the difference of the amplitude of the voltage thereto and effecting a load device disconnect operation when the compared voltages reach a given degree of difference.

13. The power amplifier of claim 12 wherein said comparison circuit responds to said voltage difference when it is of a reverse polarity from the bridge circuit output at normal load device impedance levels.

14. A power amplifier which is to amplify an input AC signal with a varying amplitude and waveshape with minimum signal distortion, said power amplifier comprising: transistor or transistor-like current amplifying means with load terminal means connected through load circuit means to the terminals of a source of direct current voltage and control terminal means connected to signal drive means which varies the magnitude of drive current fed through the load terminal means, current limiting means connected to the control terminal means of the transistor or transistor-like current amplifying means which control the upper levels of the drive current fed through the control terminal means of said current amplifying means to minimize damage thereto, and an additional protection circuit including means responsive both to various combinations of progressively lower than normal impedances in the load circuit means and progressively increasing degrees of control drive current applied to said transistor or transistor-like current amplifying means by resettably terminating power amplifier current for at least a considerable period after such termination is initiated when such combined conditions approach transistor damaging conditions of operation.

* * * * *